United States Patent
Wu et al.

(10) Patent No.: US 11,830,797 B2
(45) Date of Patent: Nov. 28, 2023

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 67 days.

(21) Appl. No.: 17/359,782

(22) Filed: Jun. 28, 2021

(65) Prior Publication Data

US 2021/0327797 A1    Oct. 21, 2021

Related U.S. Application Data

(62) Division of application No. 16/515,288, filed on Jul. 18, 2019, now Pat. No. 11,049,802.

(51) Int. Cl.
*H01L 23/498*        (2006.01)
*H01L 25/16*         (2023.01)
(Continued)

(52) U.S. Cl.
CPC ...... *H01L 23/49822* (2013.01); *H01L 21/486* (2013.01); *H01L 21/4857* (2013.01);
(Continued)

(58) Field of Classification Search
CPC ... H01L 23/49822; H01L 28/40; H01L 25/16; H01L 23/49816; H01L 21/4857; H01L 23/49827; H01L 21/486; H01L 24/13; H01L 24/16; H01L 24/20; H01L 24/32; H01L 24/81; H01L 24/83; H01L 2221/68345; H01L 2221/68359; H01L 2224/03828; H01L 2224/04105; H01L 2224/12105; H01L 2224/131; H01L 2224/2919; H01L 21/6835; H01L 23/145; H01L 2224/16227; H01L 2224/32225;
(Continued)

(56) References Cited

U.S. PATENT DOCUMENTS 8,993,380 B2    3/2015    Hou et al.
9,281,254 B2    3/2016    Yu et al.
(Continued)

*Primary Examiner* — Victor A Mandala
(74) *Attorney, Agent, or Firm* — Slater Matsil, LLP

(57) ABSTRACT

A package includes a first layer of molding material, a first metallization layer on the first layer of molding material, a second layer of molding material on the first metallization layer and the first layer of molding material, a second metallization layer on the second layer of molding material, through vias within the second layer of molding material, the through vias extending from the first metallization layer to the second metallization layer, integrated passive devices within the second layer of molding material, a redistribution structure electrically on the second metallization layer and the second layer of molding material, the redistribution structure connected to the through vias and the integrated passive devices, and at least one semiconductor device on the redistribution structure, the at least one semiconductor device connected to the redistribution structure.

20 Claims, 16 Drawing Sheets

(51) Int. Cl.
*H01L 49/02* (2006.01)
*H01L 21/48* (2006.01)

(52) U.S. Cl.
CPC .. *H01L 23/49816* (2013.01); *H01L 23/49827* (2013.01); *H01L 25/16* (2013.01); *H01L 28/40* (2013.01)

(58) Field of Classification Search
CPC . H01L 2224/73204; H01L 2224/81005; H01L 2224/81011; H01L 2224/81024; H01L 2224/81121; H01L 2224/81192; H01L 2224/81193; H01L 2224/81815; H01L 2224/83005; H01L 2224/83102; H01L 2224/83104; H01L 2224/83855; H01L 2224/92125; H01L 2924/15311; H01L 2924/19105; H01L 23/5389; H01L 25/50; H01L 23/4824; H01L 24/03; H01L 2224/0231; H01L 2224/02331; H01L 2224/02379; H01L 2224/02381; H01L 2924/00014; H01L 2224/16225; H01L 2924/00; H01L 2924/0665

See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 11,031,675 B2* | 6/2021 | Kim | H01Q 21/065 |
| 11,380,666 B2* | 7/2022 | Tsai | H01L 24/73 |
| 11,456,251 B2* | 9/2022 | Chen | H01L 21/56 |
| 2014/0185264 A1* | 7/2014 | Chen | H01L 23/3128 361/814 |
| 2015/0382463 A1* | 12/2015 | Kim | H05K 3/4007 29/829 |
| 2016/0343694 A1* | 11/2016 | Lin | H01L 24/94 |
| 2017/0098628 A1* | 4/2017 | Liu | H01L 23/3142 |
| 2017/0243826 A1* | 8/2017 | Lin | H01L 21/4853 |
| 2017/0317053 A1* | 11/2017 | Hung | H01L 25/0652 |
| 2018/0102313 A1* | 4/2018 | Shih | H01L 21/6835 |
| 2018/0337122 A1* | 11/2018 | Liao | H01L 23/50 |
| 2019/0057949 A1* | 2/2019 | Hwang | H01L 21/6835 |
| 2019/0139912 A1* | 5/2019 | Kim | H01L 21/4853 |
| 2019/0173184 A1* | 6/2019 | Kim | G06K 19/07775 |
| 2019/0287938 A1* | 9/2019 | Kim | H01L 24/19 |
| 2019/0393153 A1* | 12/2019 | Wang | H01L 21/76898 |
| 2020/0105544 A1* | 4/2020 | Tsai | H01L 21/4853 |
| 2020/0135840 A1* | 4/2020 | Chen | H01L 23/3121 |
| 2020/0212018 A1* | 7/2020 | Lai | H01L 23/3121 |
| 2021/0151381 A1* | 5/2021 | Huang | H01L 23/5389 |
| 2022/0328418 A1* | 10/2022 | Wu | H01L 23/562 |

\* cited by examiner

SEMICONDUCTOR DEVICE AND METHOD OF MANUFACTURE

PRIORITY

This application is a divisional of U.S. patent application Ser. No. 16/515,288, filed on Jul. 18, 2019, now U.S. Pat. No. 11,049,802, entitled "Semiconductor Device and Method of Manufacture," which application is hereby incorporated by reference.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
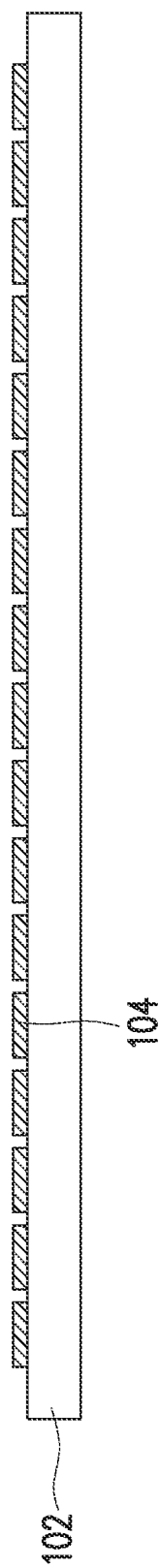
FIGS. 1 through 8 illustrate cross-sectional views of intermediate steps of forming an interconnect structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a device package and the formation thereof are described. The device package may be, for example, a system-in-package. In some embodiments, an integrated passive device may be formed within a layer of molding material, and then a redistribution structure may be formed over the molding material. A semiconductor device is then attached to the redistribution structure. By locating the integrated passive device within a layer of molding material and connected to the redistribution structure, the distance between the semiconductor device and the integrated passive device may be reduced and the electrical performance of the package may be improved. Additionally, the molding material may provide increased structural support and reduce warping of the package.

Figure 9:
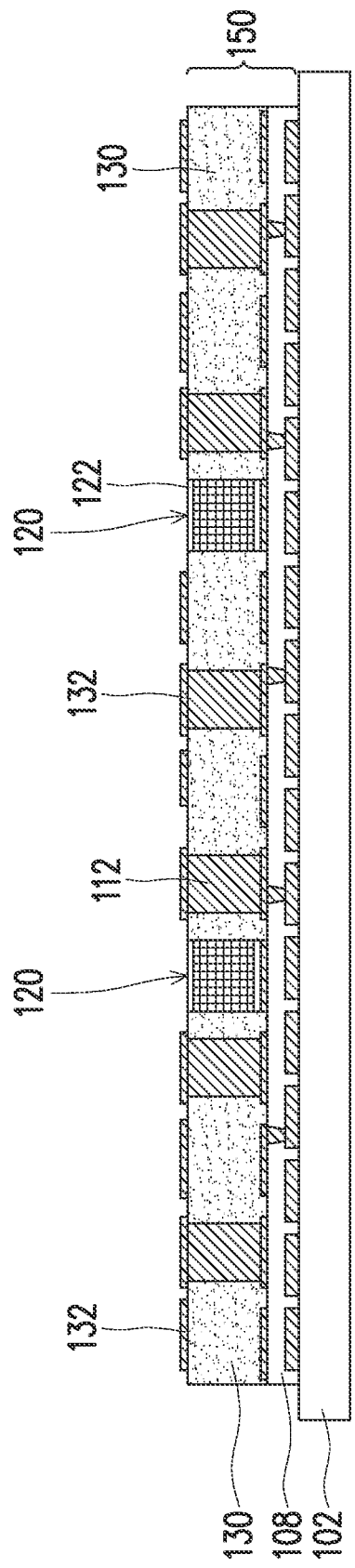
FIGS. 9 through 10 illustrate cross-sectional views of intermediate steps of forming a redistribution structure, in accordance with some embodiments.
Figure 10:
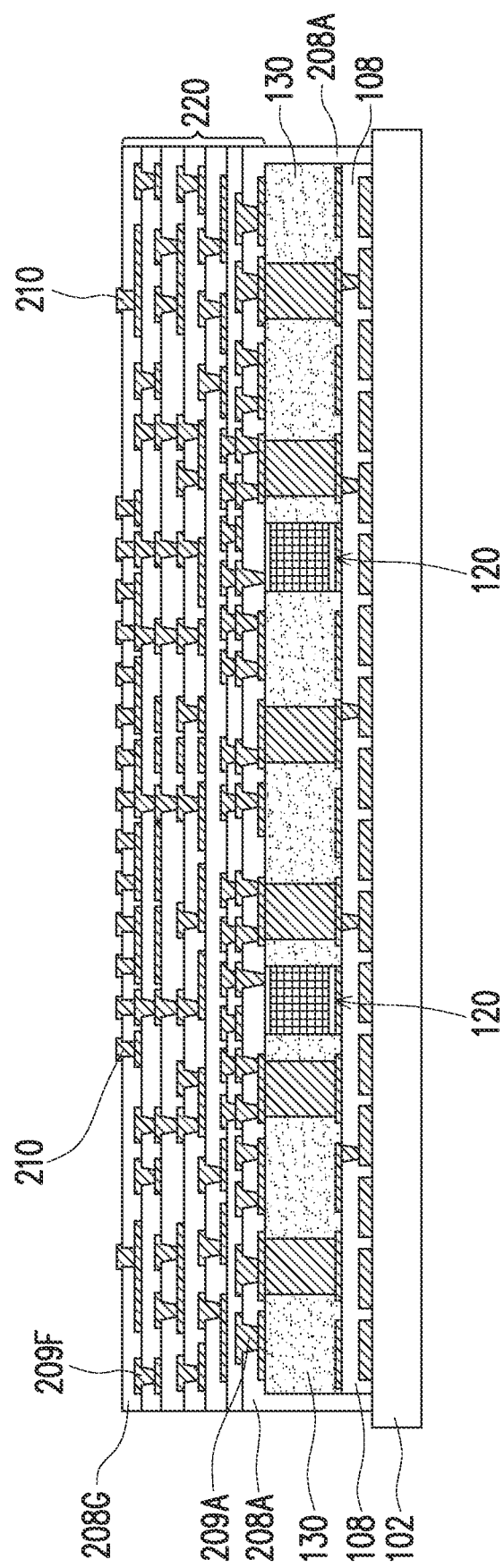

FIGS. 1 through 14 illustrate cross-sectional views of intermediate steps of forming a package structure 400 (see FIG. 14), in accordance with some embodiments. FIGS. 1 through 8 illustrate cross-sectional views of intermediate steps of forming an interconnect structure 150 (see FIG. 8), in accordance with some embodiments. FIGS. 9 through 10 illustrate cross-sectional views of intermediate steps of forming a redistribution structure 220 (see FIG. 10), in accordance with some embodiments. FIGS. 11 through 14 illustrate cross-sectional views of intermediate steps of forming a package structure 400 (see FIG. 14), in accordance with some embodiments.

With reference now to FIG. 1, there is shown a carrier substrate 102 on which contact pads 104 have been formed, in accordance with some embodiments. The carrier substrate 102 may include, for example, silicon-based materials, such as a silicon substrate (e.g., a silicon wafer), a glass material, silicon oxide, or other materials, such as aluminum oxide, the like, or a combination. In some embodiments, the carrier substrate 102 may be a panel structure, which may be, for example, a supporting substrate formed from a suitable dielectric material, such as a glass material or an organic material, and which may have a rectangular shape. The carrier substrate 102 may be planar in order to accommodate the formation of additional features, such as the contact pads 104.

Figure 14:
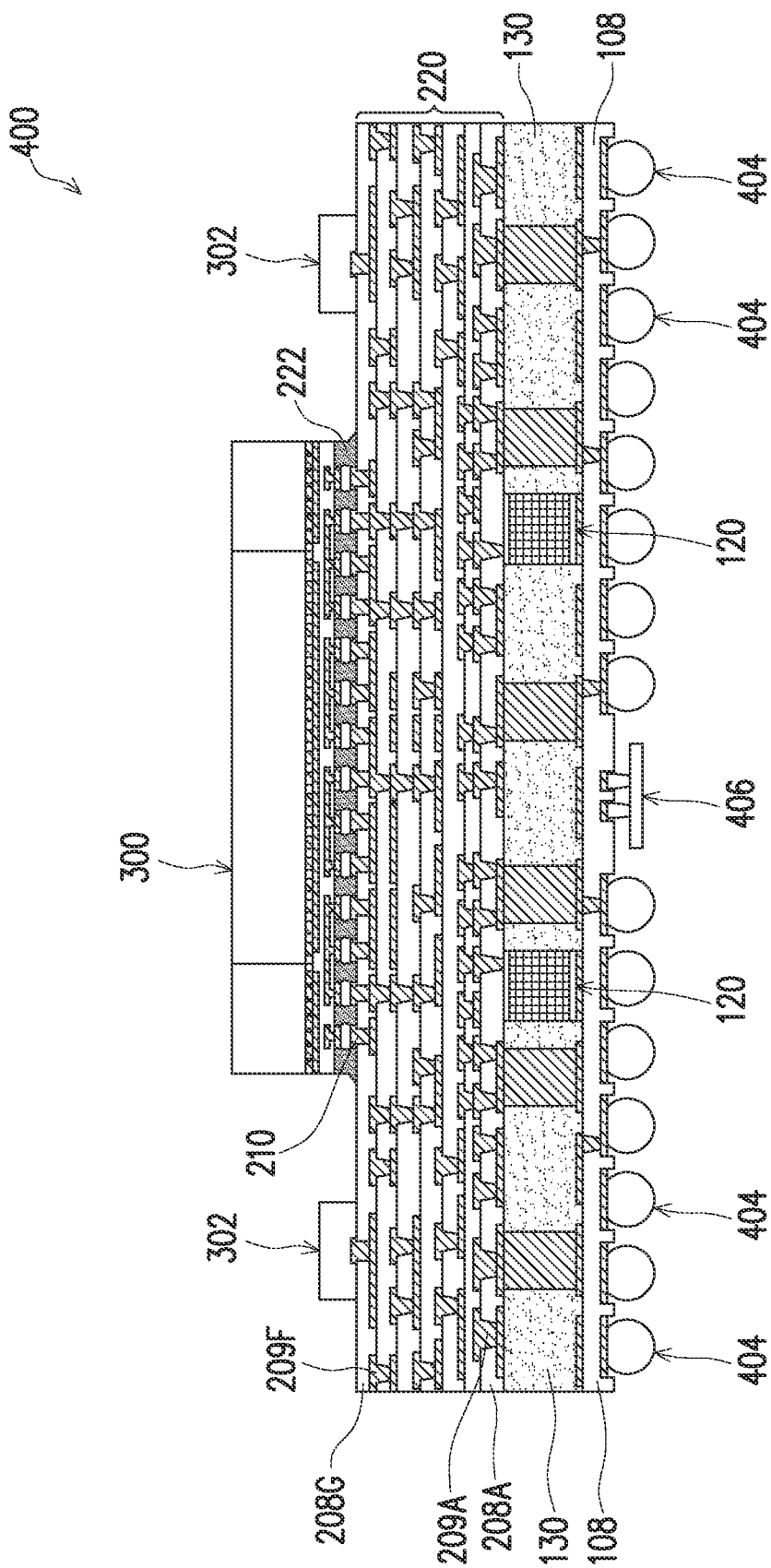
Figure 15A:
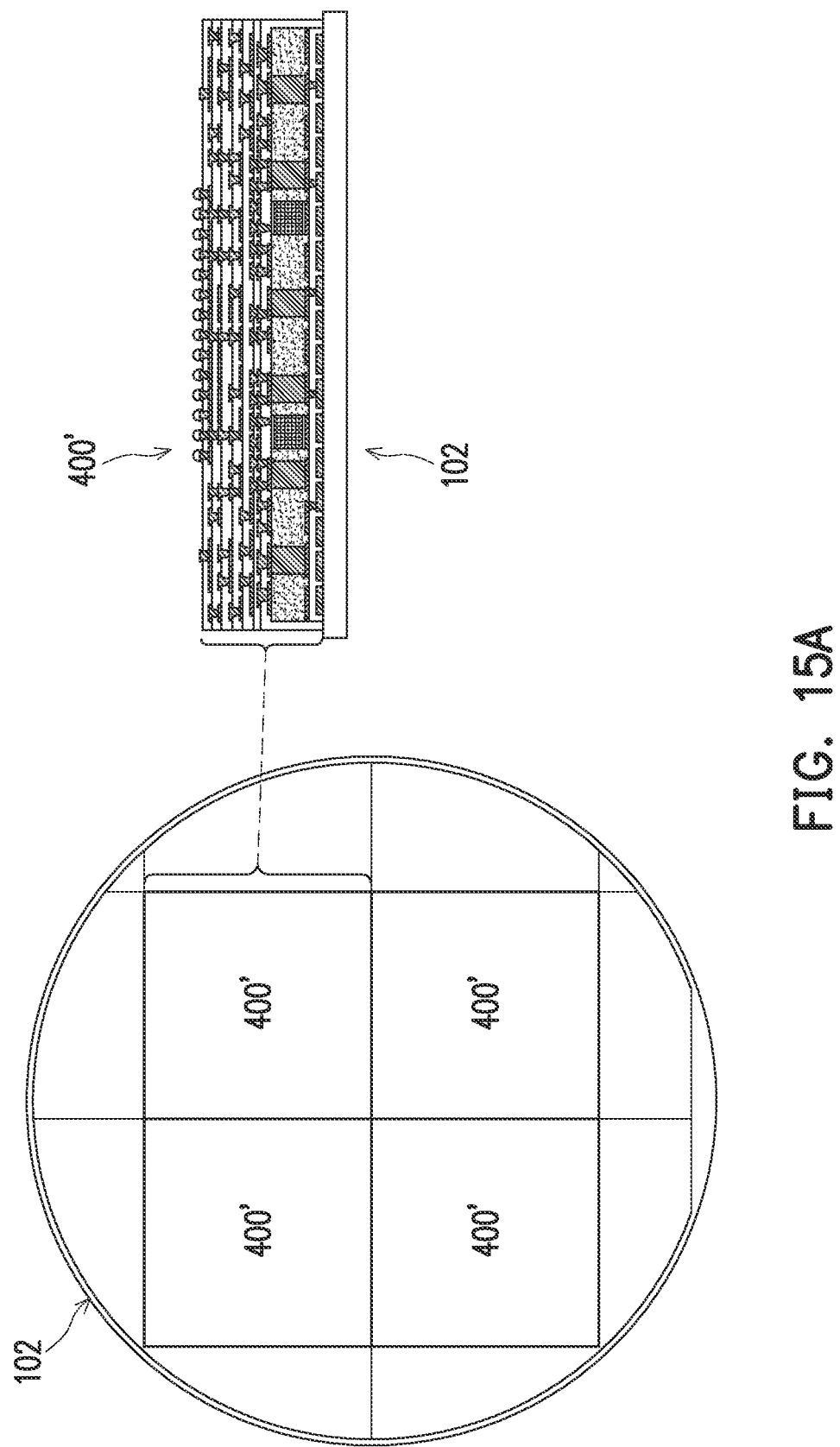
FIGS. 15A and 15B illustrate intermediate steps of forming a package structure on different types of carrier substrates, in accordance with some embodiments.
Figure 15B:
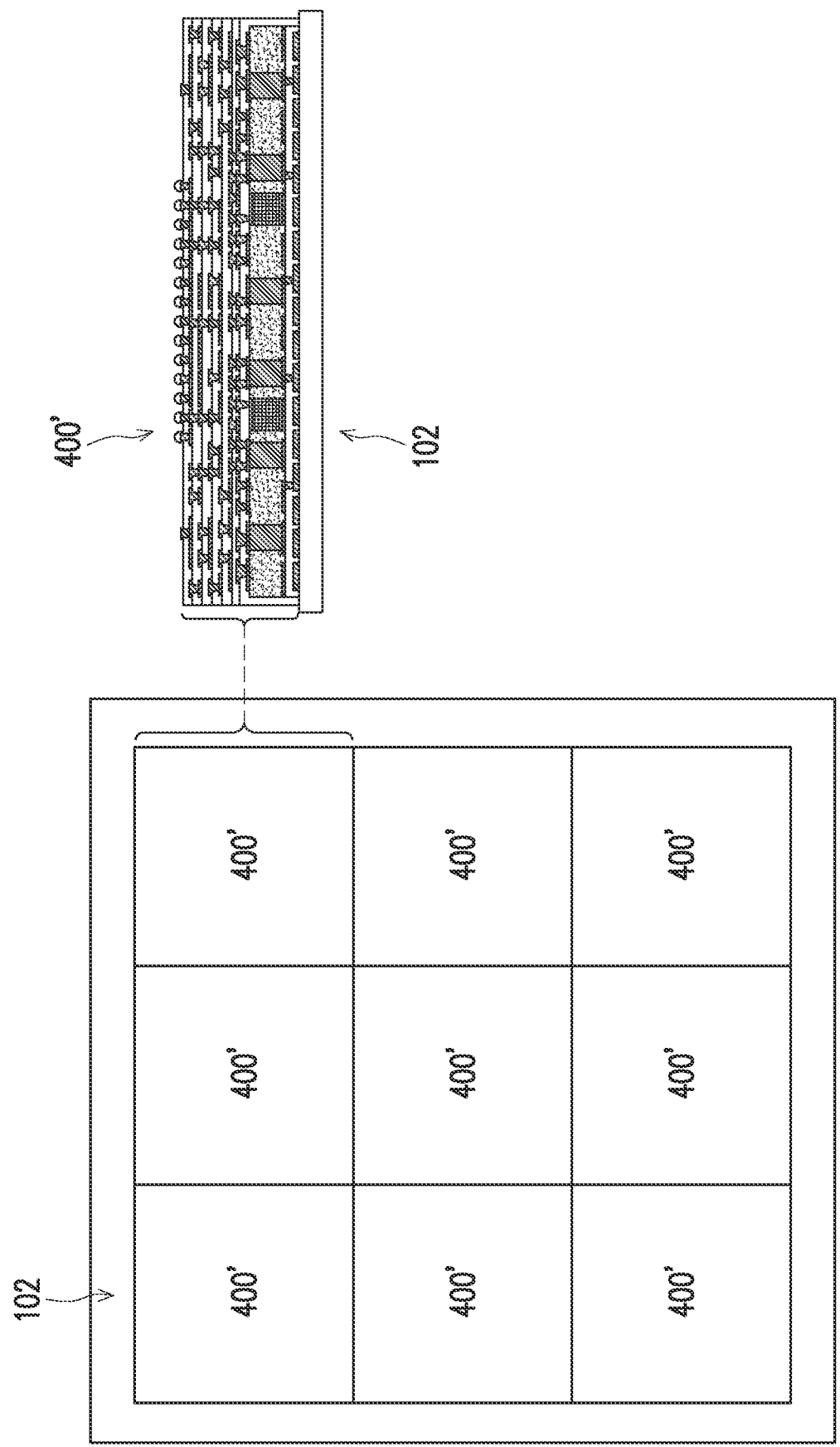

As illustrative examples, FIGS. 15A and 15B show intermediate structures 400' in the formation of package structures 400 using different types of carrier substrates 102, in accordance with some embodiments. FIG. 15A shows an embodiment in which the carrier substrate 102 is a silicon wafer, and FIG. 15B shows an embodiment in which the carrier substrate 102 is a panel structure. FIGS. 15A-15B show multiple intermediate structures 400' formed on the carrier substrates 102. The intermediate structures 400' shown correspond approximately to the intermediate structure shown in FIG. 11 during the formation of package structures 400, but any or all of the embodiments or structures described with respect to FIGS. 1 through 14 may be similarly applicable. In this manner, different types of carrier substrates 102 may be used to form multiple package structures 400. The intermediate structures 400' formed on a carrier substrate 102 may be subsequently singulated to form individual package structures 400, described below with respect to FIG. 14.

Turning back to FIG. 1, in some embodiments, a release layer (not shown) may be formed on the top surface of the carrier substrate 102 to facilitate subsequent debonding of the carrier substrate 102. The release layer may be formed of a polymer-based material, which may be removed along with the carrier substrate 102 from the overlying structures that will be formed in subsequent steps. In some embodiments, the release layer is an epoxy-based thermal-release material, which loses its adhesive property when heated, such as a Light-to-Heat-Conversion (LTHC) release coating. In other embodiments, the release layer may be an ultra-violet (UV) glue, which loses its adhesive property when exposed to UV light. The release layer may be dispensed as a liquid and cured, may be a laminate film laminated onto the carrier substrate 102, or the like. The top surface of the release layer may be leveled and may have a high degree of co-planarity.

In an embodiment, the contact pads 104 may be formed by initially forming a seed layer (not shown) of one or more layers of titanium, copper, or a titanium-copper alloy using a suitable formation process such as PVD, CVD, sputtering, or the like. The seed layer is formed over the carrier substrate 102 or a release layer, if present. A photoresist (also not shown) may then be formed to cover the seed layer and then be patterned to expose those portions of the seed layer that are located where the contact pads 104 will subsequently be formed. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating or electroless plating, or the like. However, while the material and methods discussed are suitable to form the conductive material, these are merely examples. Any other suitable materials or any other suitable processes of formation, such as CVD or PVD, may alternatively be used to form the contact pads 104. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the contact pads 104.

Figure 2:
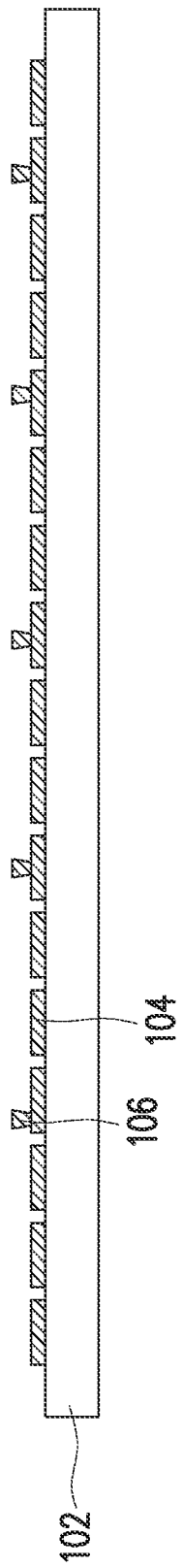

Turning to FIG. 2, contact vias 106 are formed over the contact pads 104. In some embodiments, the contact vias 106 may be formed in a manner similar to the contact pads 104. For example, the contact vias 106 may be formed by initially forming a seed layer (not shown) of one or more layers of titanium, copper, or a titanium-copper alloy using a suitable formation process such as PVD, CVD, sputtering, or the like. A photoresist (also not shown) may then be formed to cover the seed layer and then be patterned to expose those portions of the seed layer that are located where the contact vias 106 will subsequently be formed. Once the photoresist has been formed and patterned, a conductive material may be formed on the seed layer using, for example, a plating process. The conductive material may be a material such as copper, titanium, tungsten, aluminum, another metal, the like, or a combination thereof. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the contact pads 106.

Figure 3:
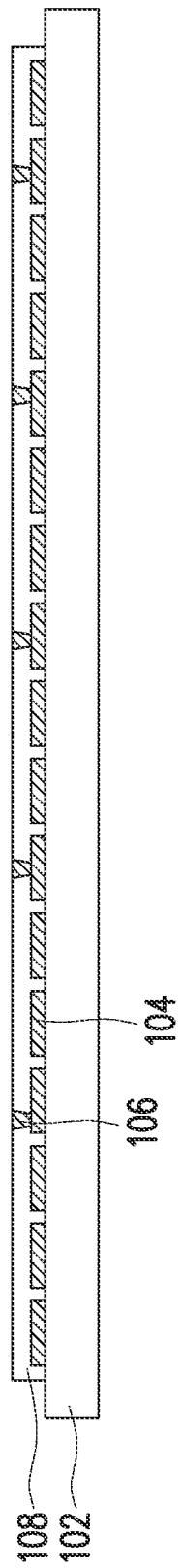

Turning to FIG. 3, a first molding material 108 is formed over the substrate 102, contact pads 104, and contact vias 106. The first molding material 108 laterally surrounds the contact pads 104 and laterally surrounds contact vias 106. The first molding material 108 may be formed as covering top surfaces of the contact pads 104 or top surfaces of the contact vias 106 and then subsequently planarized, as described below. The first molding material 108 may comprise an epoxy, an organic polymer, a polymer with or without a silica-based or glass filler added, or other materials, as examples. In some embodiments, the first molding material 108 comprises a liquid molding compound (LMC) that is a gel type liquid when applied. The first molding material 108 may also comprise a liquid or solid when applied. Alternatively, the first molding material 108 may comprise other insulating or encapsulating materials. The first molding material 108 is applied using a wafer level molding process in some embodiments. The first molding material 108 may be molded using, for example, compressive molding, transfer molding, or other techniques.

In some embodiments, the first molding material 108 may be cured using a curing process. The curing process may comprise heating the first molding material 108 to a predetermined temperature for a predetermined period of time, using an anneal process or other heating process. The curing process may also comprise an ultra-violet (UV) light exposure process, an infrared (IR) energy exposure process, combinations thereof, or the like. Alternatively, the first molding material 108 may be cured using other techniques. In some embodiments, a curing process is not performed.

Still referring to FIG. 3, a planarization process, such as chemical-mechanical polish (CMP) process or a grinding process, may optionally be performed to remove excess portions of the first molding material 108 over the contact pads 104 and contact vias 106. Top surfaces of the contact vias 106 may be exposed after performing the planarization process, as shown in FIG. 3. In some embodiments, after the planarization process, the first molding material 108 and the contact vias 106 have top surfaces that are coplanar. In some embodiments, after the planarization process, the first molding material 108 has a thickness between about 2 μm and about 150 μm. The use of a molding material (e.g. first molding material 108) to surround the contact pads 104 and contact vias 106 may provide structural support or increased rigidity that reduces the amount of warping in the final device.

Figure 4:
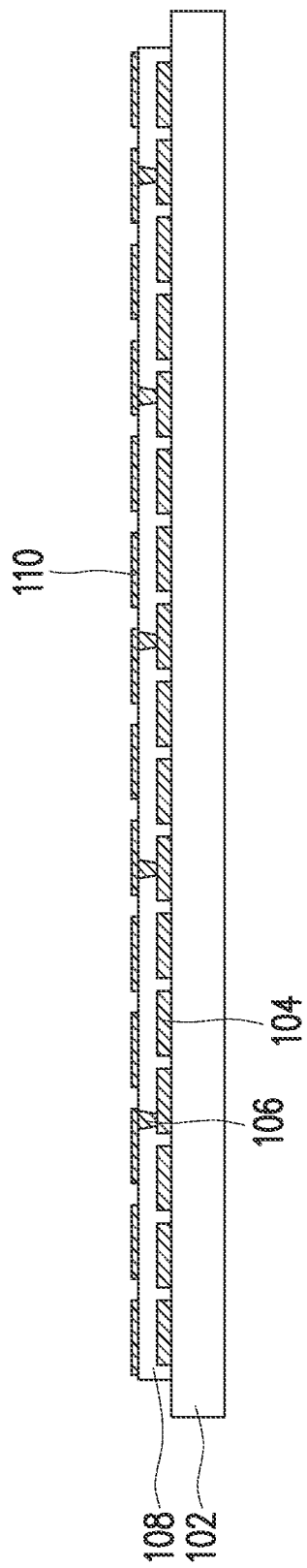

Turning to FIG. 4, first metallization layer 110 is formed over the first molding material 108 and contact vias 106. In some embodiments, the first metallization layer 110 may be formed in a manner similar to the contact pads 104 or contact vias 106. For example, the first metallization layer 110 may be formed by initially forming a seed layer (not shown) of one or more layers of titanium, copper, or a titanium-copper alloy using a suitable formation process such as PVD, CVD, sputtering, or the like. A photoresist (also not shown) may then be formed to cover the seed layer and then be patterned to expose those portions of the seed layer that are located where the pattern of the first metallization layer 110 will subsequently be formed. Once the photoresist has been formed and patterned, a conductive material may be formed on the seed layer using, for example, a plating process. The conductive material may be a material such as copper, titanium, tungsten, aluminum, another metal, the like, or a combination thereof. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the first metallization layer 110.

Figure 5:
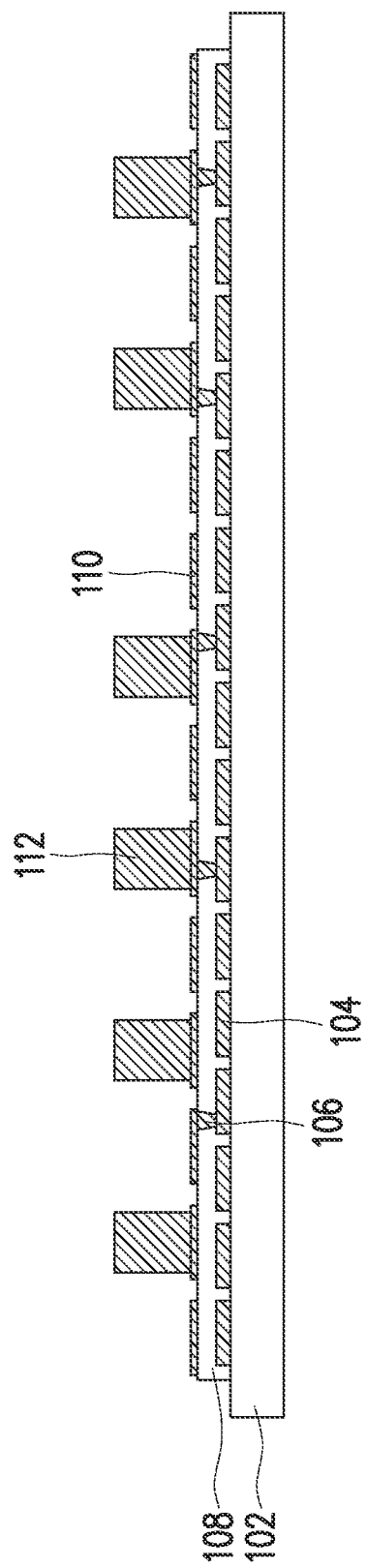

Turning to FIG. 5, through vias 112 are formed over the first metallization layer 110 and the first molding material 108. In some embodiments, the through vias 112 may be formed by forming a seed layer over the first metallization layer 110 and the first molding material 108 and then forming a patterned photoresist over the seed layer, where each of the openings in the patterned photoresist corresponds to a location of the through via 112 to be formed. The openings in the patterned photoresist are filled with an electrically conductive material such as copper using a suitable technique such as electroplating or electroless plating. The photoresist is then removed using a suitable process such as an ashing or a stripping process. Portions of the seed layer on which the through vias 112 are not formed may then be removed using a suitable etching process. The through vias 112 may be formed as conductive pillars extending above the first metallization layer 110 and the first molding material 108. Other techniques for forming the through vias 112 are also possible and are fully intended to be included within the scope of the present disclosure. In some embodiments, the through vias 112 may be formed having a height between about 25 μm and about 1000 μm or a width between about 10 μm and about 500 μm.

Figure 6:
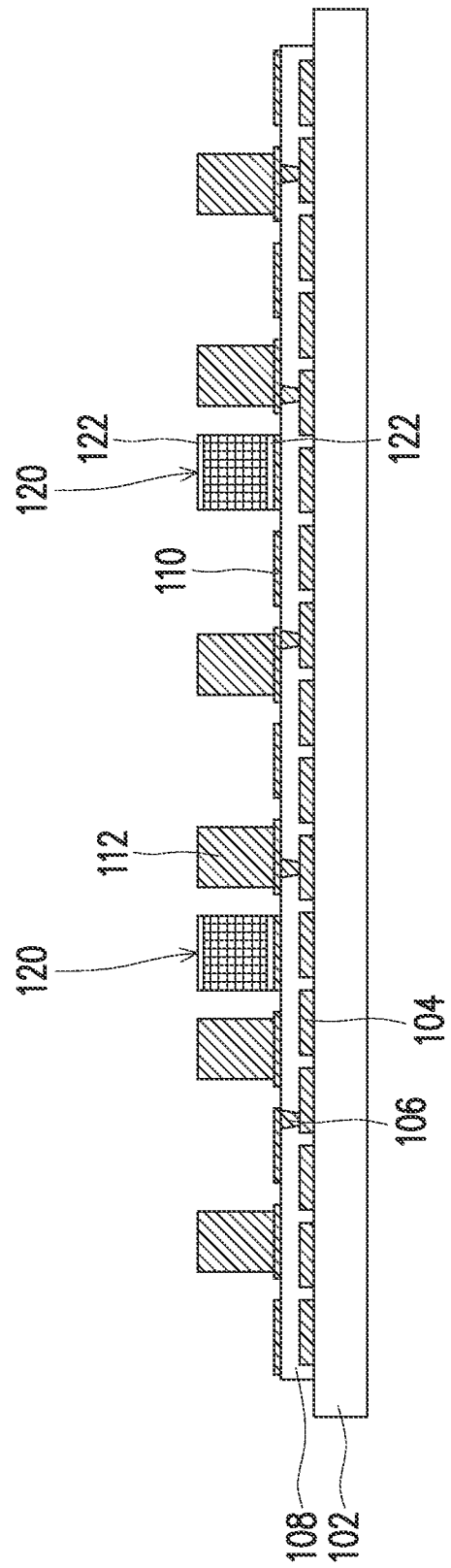

Next, in FIG. 6, an electrical device 120 is attached to the first metallization layer 110, in accordance with some embodiments. The electrical device 120 may be a die, chip, or package, a semiconductor device or other device that includes a one or more passive devices such as capacitors, resistors, inductors, and the like. The electrical device 120 may be, for example, an integrated passive device (IPD). In some embodiments, the electrical device 120 is a passive device comprising a capacitor, such as a multi-layer ceramic capacitor (MLCC) or the like. In some embodiments, the electrical device 120 has a thickness between about 5 μm and about 1000 μm. The electrical device 120 may have a thickness that is less than, greater than, or about the same as the through vias 112. In some cases, by attaching the electrical devices 120 adjacent the through vias 112, the routing distance between the electrical devices 120 and a semiconductor device (e.g., semiconductor device 300 of FIG. 12) may be reduced, which can reduce inductance and resistance between an electrical devices 120 and the semiconductor device. In this manner, a shorter routing distance can improve higher frequency operation of the device and provide improved voltage or current stability.

The electrical device 120 may comprise conductive connectors 122 on one or more sides. For example, FIG. 6 shows the electrical device 120 having conductive connectors 122 on opposite sides of the electrical device 120, but in other embodiments an electrical device 120 may have conductive connectors 122 on only one side of the electrical device 120. In some embodiments, the electrical device 120 is electrically connected to one or more regions of the first metallization layer 110 through the conductive connectors 122. The conductive connectors 122 may include conductive bumps, solder regions, conductive pads, or the like. The electrical device 120 may be connected to the first metallization layer 110, for example, by sequentially dipping the conductive connectors 122 into flux, and then using a pick-and-place tool in order to physically align the conductive connectors 122 with corresponding regions of the first metallization layer 110. In some cases, a reflow may be performed to bond the conductive connectors 122 to the first metallization layer 110. In some embodiments, the electrical device 120 may be configured to provide voltage or current stabilization for the final device. In some embodiments, one electrical device 120 or more than two electrical devices 120 may be connected to the first metallization layer 110. In embodiments including multiple electrical devices 120 connected to the first metallization layer 110, the electrical devices 120 may all be similar devices or may be different types of devices.

Figure 7:
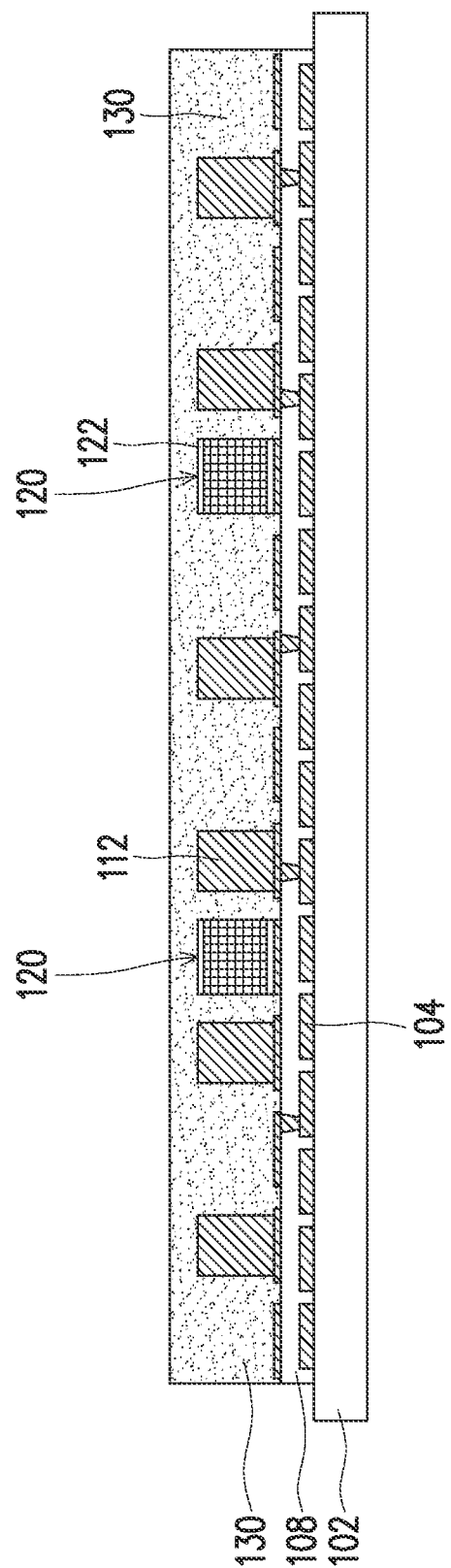

Turning to FIG. 7, a second molding material 130 is formed over the first molding material 108, first metallization layer 110, through vias 112, and electrical devices 120. The second molding material 130 laterally surrounds the through vias 112 and laterally surrounds the electrical devices 120. In some embodiments, the through vias 112 and the electrical devices 120 are separated by the second molding material 130. The second molding material 130 may be formed as covering top surfaces of the through vias 112 or top surfaces of the electrical devices 120 and then subsequently planarized, as described below. The second molding material 130 may comprise an epoxy, an organic polymer, a polymer with or without a silica-based or glass filler added, or other materials, as examples. In some embodiments, the second molding material 130 comprises a liquid molding compound (LMC) that is a gel type liquid when applied. The second molding material 130 may also comprise a liquid or solid when applied. Alternatively, the second molding material 130 may comprise other insulating or encapsulating materials. The second molding material 130 may be a material similar to or different from the first molding material 108. The second molding material 130 is applied using a wafer level molding process in some embodiments. The second molding material 130 may be molded using, for example, compressive molding, transfer molding, or other techniques. The second molding material 130 may be formed in the same manner as the first molding material 108 or in a different manner.

In some embodiments, the second molding material 130 may be cured using a curing process. The curing process may comprise heating the second molding material 130 to a predetermined temperature for a predetermined period of time, using an anneal process or other heating process. The curing process may also comprise an ultra-violet (UV) light exposure process, an infrared (IR) energy exposure process, combinations thereof, or the like. Alternatively, the second molding material 130 may be cured using other techniques. In some embodiments, a curing process is not performed. In some embodiments, the first molding material 108 and the second molding material 130 are cured simultaneously using the same curing process.

Figure 8:
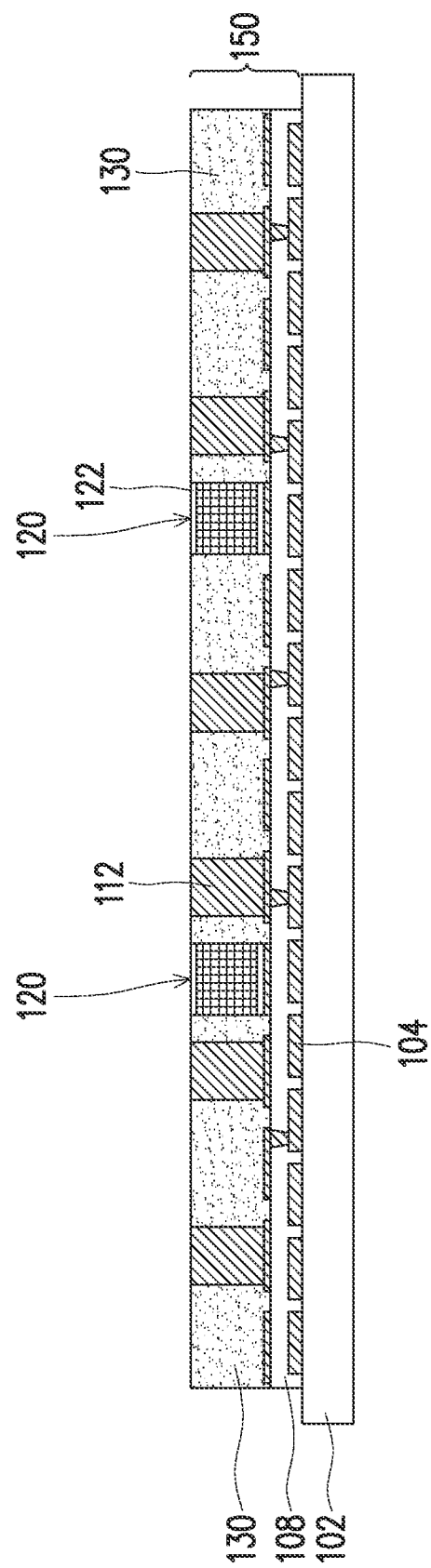

Turning to FIG. 8, a planarization process, such as a CMP process or a grinding process, may optionally be performed to remove excess portions of the second molding material 130 over the through vias 112 and electrical devices 120, forming an interconnect structure 150. The planarization process exposes top surfaces of the through vias 112. In some embodiments, the planarization process exposes top surfaces of the electrical devices 120. The exposed top surfaces of the electrical devices 120 may include conductive connectors 122, as shown in FIG. 8. In some embodiments, after the planarization process, the second molding material 130, the through vias 112, or the electrical devices 120 have top surfaces that are coplanar. In some embodiments, after the planarization process, the second molding material 130 has a thickness between about 25 µm and about 1000 µm. The use of a molding material (e.g. second molding material 130) to surround the through vias 112 or electrical devices 120 may provide structural support or increased rigidity that reduces the amount of warping in the final device. In some cases, the use of both the first molding material 108 and the second molding material 130 can reduce warping more than the use of only one of the first molding material 108 or the second molding material 130.

Turning to FIG. 9, a second metallization layer 132 is formed over the through vias 112, electrical devices 120, and the second molding material 132 of the interconnect structure 150. In some embodiments, the second metallization layer 132 may be formed by forming a seed layer and then forming a patterned photoresist over the seed layer, where each of the openings in the patterned photoresist corresponds to the pattern of the second metallization layer 132 to be formed. The openings in the patterned photoresist are filled with an electrically conductive material such as copper using a suitable technique such as electroplating or electroless plating. The photoresist is then removed using a suitable process such as an ashing or a stripping process. Excess portions of the seed layer may then be removed using a suitable etching process. The second metallization layer 132 may be formed in a manner similar to that of the first metallization layer 110, though other techniques for forming the second metallization layer 132 are also possible and are fully intended to be included within the scope of the present disclosure. In some embodiments, some or all of the exposed conductive connectors 122 of the electrical devices 120 are free of the second metallization layer 132, as shown in FIG. 9.

Turning to FIG. 10, a redistribution structure 220 is formed over the second molding material 130 and the second metallization layer 132, in accordance with some embodiments. The redistribution structure 220 shown includes insulating layers 208A-G (for clarity, only insulating layers 208A and 208G are labeled) and includes redistribution layers 209A-F (for clarity, only redistribution layers 209A and 209F are labeled). In some cases, the second metallization layer 132 or the conductive connectors 210 (described in greater detail below) may be considered to be part of the redistribution structure 220. In other embodiments, different numbers of insulating layers or redistribution layers may be formed in the redistribution structure 220 than described herein. In some embodiments, the redistribution structure 220 may be formed in a different process than that described herein. In some embodiments, the redistribution structure 220 may be, for example, a fan-out structure. In some embodiments, the redistribution structure 220 above the second molding material 130 may have a thickness between about 50 µm and about 500 µm.

Still referring to FIG. 10, the insulating layer 208A is formed over the second metallization layer 132 and over a top surface of the second molding material 130. In some embodiments, the insulating layer 208A may also be formed over the sidewalls of the first molding material 108 and over sidewalls of the second molding material 130, as shown in FIG. 10. In some embodiments, the sidewalls of the first molding material 108 or second molding material 130 are free of the insulating layer 208A. For example, in some embodiments, multiple package structures 400 may be formed on a single carrier substrate 102 (e.g., as shown in FIGS. 15A-B), and the first molding material 108 and/or the second molding material 130 is formed extending fully between adjacent package structures 400. The insulating layer 208A may be made of one or more suitable dielectric materials such as an oxide (e.g., silicon oxide), a nitride (e.g., silicon nitride), a polymer material (e.g., a photosensitive polymer material), a polyimide material, a low-k dielectric material, another dielectric material, the like, or a combination thereof. The insulating layer 208A may be formed by a process such as spin-coating, lamination, CVD, the like, or a combination thereof. The insulating layer 208A may have a thickness over the second molding material 130 of between about 30 µm and about 1000 µm, such as about 500 µm, although any suitable thickness may be used. Openings into the insulating layer 208A may be formed using a suitable photolithographic mask and etching process. For example, a photoresist may be formed and patterned over the insulating layer 208A, and one or more etching processes (e.g., a wet etching process or a dry etching process) are utilized to remove portions of the insulating layer 208A. In some embodiments, the insulating layer 208A is formed of a photosensitive polymer such as PBO, polyimide, BCB, or the like, in which openings may be patterned directly using a photolithographic mask and etching process. The openings in the insulating layer 208A may expose second metallization layer 132 or conductive connectors 122 of the electrical devices 120.

The redistribution layer 209A may then be formed to provide additional routing along with electrical connection within the redistribution structure 220. In an embodiment, the redistribution layer 209A may be formed using materials and processes similar to the second metallization layer 132. For example, a seed layer may be formed, a photoresist placed and patterned on top of the seed layer in a desired pattern for the redistribution layer 209A. Conductive material (e.g., copper, titanium, or the like) may then be formed in the patterned openings of the photoresist using e.g., a plating process. The photoresist may then be removed and the seed layer etched, forming redistribution layer 209A. In this manner, the redistribution layer 209A may form electrical connections to the second metallization layer 132 or conductive connectors 122.

Additional insulating layers 208B-G and redistribution layers 209B-F may then be formed over the redistribution layer 209A and insulating layer 208A to provide additional routing along with electrical connection within the redistribution structure 220. The insulating layers 209B-G and redistribution layers 209B-F may be formed in alternating layers, and may be formed using processes and materials similar to those used for the insulating layer 208A or the redistribution layer 209A. For example, an insulating layer (e.g., insulating layer 208B) may be formed over a redistribution layer (e.g., redistribution layer 209A), and then openings made through the insulating layer to expose portions of the underlying redistribution layer using a suitable photolithographic mask and etching process. A seed layer may be formed over the insulating layer and conductive material formed on portions of the seed layer, forming an overlying redistribution layer (e.g., redistribution layer 209B). These steps may be repeated to form a redistribution structure 220 having a suitable number and configuration of insulation layers and redistribution layers. Alternatively, the insulating layer 208B-G or redistribution layers 209B-F may be formed differently than the insulating layer 208A or redistribution layer 209A. The insulating layers 208B-G may be formed to each have a thickness between about 5 μm and about 60 μm, such as about 15 μm. Portions of each of the redistribution layers 209B-F may be formed to have a thickness between about 1 μm and about 20 μm, such as about 7 μm. In some embodiments, the redistribution structure 220 is a fan-out structure. In other embodiments, the second redistribution structure 220 may be formed in a different manner than described herein.

Still referring to FIG. 10, conductive connectors 210 are formed over the topmost redistribution layer of the redistribution structure 220 (e.g., redistribution layer 209F). In some embodiments, the conductive connectors 210 may be formed in a manner similar to the redistribution layers 209A-F. For example, openings made through the top most insulating layer (e.g. insulating layer 208G) to expose portions of the underlying redistribution layer (e.g., redistribution layer 209F) using a suitable photolithographic mask and etching process. A seed layer may be formed over the insulating layer and a conductive material formed on portions of the seed layer, forming conductive connectors 210.

Still referring to FIG. 10, in some embodiments, the conductive connectors 210 comprise under-bump metallization structures (UBMs, not shown). The UBMs may, for example, include three layers of conductive materials, such as a layer of titanium, a layer of copper, and a layer of nickel. However, other arrangements of materials and layers may be used, such as an arrangement of chrome/chrome-copper alloy/copper/gold, an arrangement of titanium/titanium tungsten/copper, or an arrangement of copper/nickel/gold, that are suitable for the formation of the UBMs. Any suitable materials or layers of material that may be used for the UBMs and are fully intended to be included within the scope of the current application. The UBMs may be created by forming each layer of the UBMs over the topmost insulating layer of the redistribution structure 220 and within openings formed in the topmost insulating layer. Each layer of the UBMs may be formed over previously deposited conductive material of the conductive connectors 210. The forming of each layer may be performed using a plating process, such as electroplating or electroless plating, although other processes of formation, such as sputtering, evaporation, or PECVD process, may alternatively be used depending upon the desired materials. Once the desired layers have been formed, portions of the layers may then be removed through a suitable photolithographic masking and etching process to remove the undesired material and to leave the UBMs in a desired shape, such as a circular, octagonal, square, or rectangular shape, although any desired shape may alternatively be formed.

Figure 11:
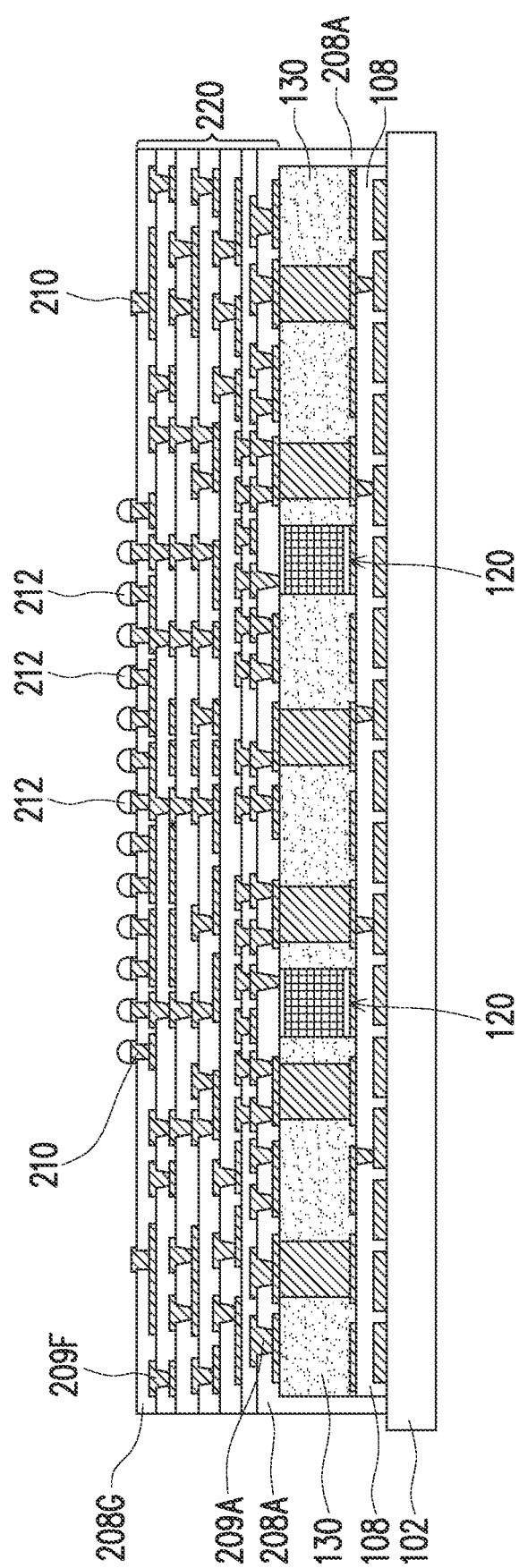
FIGS. 11 through 14 illustrate cross-sectional views of intermediate steps of forming a package structure, in accordance with some embodiments.

Turning to FIG. 11, external connectors 212 are formed over the conductive connectors 210. The external connectors 212 may be formed over UBMs, if present. The external connectors 212 may be, for example, contact bumps or solder balls, although any suitable types of connectors may be utilized. In an embodiment in which the external connectors 212 are contact bumps, the external connectors 212 may include a material such as tin, or other suitable materials, such as silver, lead-free tin, or copper. In an embodiment in which the external connectors 212 are tin solder bumps, the external connectors 212 may be formed by initially forming a layer of tin using such a technique such as evaporation, electroplating, printing, solder transfer, ball placement, etc. Once a layer of tin has been formed on the structure, a reflow may be performed in order to shape the material into the desired bump shape for the external connectors 212. In some embodiments, one or more conductive connectors 210 are left free of the external connectors 212, for example, in regions where passive devices 302 (see FIG. 12) may be connected. In some embodiments, the external connectors 212 may have a thickness between about 3 μm and about 50 μm. In some embodiments, the external connectors 212 may have a pitch between about 20 μm and about 250 μm.

Figure 12:
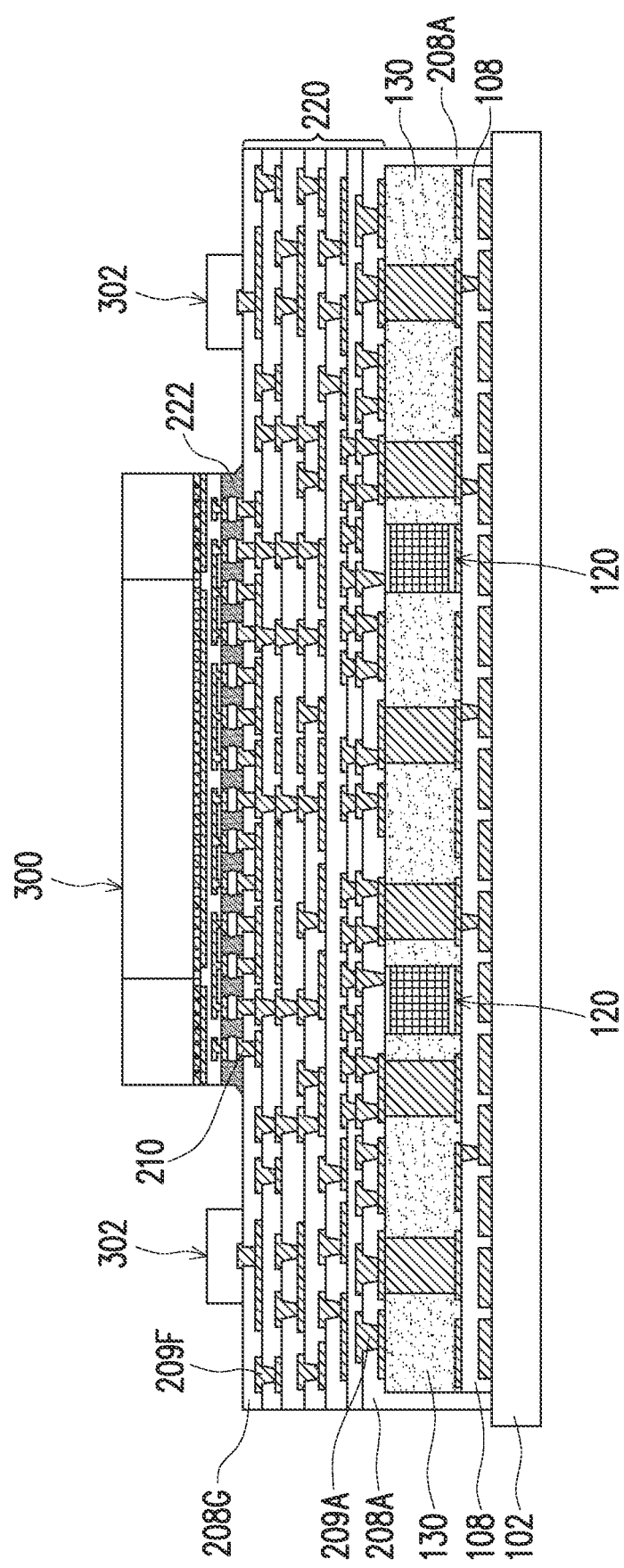

Turning to FIG. 12, one or more semiconductor devices 300 are attached to the external connectors 212 to make electrical connection with the redistribution structure 220. One or more integrated devices 302 may also be connected to the redistribution structure 220, and may be attached to external connectors 212 or to conductive connectors 210 (as shown). The semiconductor device 300 or the integrated devices 302 may be connected to the external connectors 212 or conductive connectors 210, for example, by sequentially dipping connectors (e.g., conductive bumps or pads) of the semiconductor device 300 or integrated devices 302 such as solder balls (not shown) into flux, and then using a pick-and-place tool in order to physically align the connectors of the semiconductor device 300 or the integrated devices 302 with corresponding external connectors 212 or conductive connectors 210. In some cases, a reflow may be performed to bond the connectors of the semiconductor device 300 or the integrated devices 302 to the external connectors 212 or conductive connectors 210.

As shown in FIG. 12, an underfill material 222 may be dispensed between the semiconductor device 300 and the redistribution structure 220. The underfill material 222 surrounds the external connectors 212 and conductive connectors 210. The underfill material 222 may be any acceptable material, such as a polymer, epoxy, molding underfill, or the like. The underfill material 222 may be dispensed using a needle or a jetting dispenser, using a capillary flow process, or using another suitable process. In some embodiments, a curing process may be performed to cure the underfill material 222. Although not shown in FIG. 12, the underfill material 222 may extend along sidewalls of the semiconductor device 300. The semiconductor device 300 may include one or more devices, which may include devices designed for an intended purpose such as a memory die (e.g., a DRAM die, a stacked memory die, a high-bandwidth memory (HBM) die, etc.), a logic die, a central processing unit (CPU) die, a system-on-a-chip (SoC), a component on a wafer (CoW), an integrated fan-out structure (InFO), a package, the like, or a combination thereof. In an embodiment, the semiconductor device 300 includes integrated circuit devices, such as transistors, capacitors, inductors, resistors, metallization layers, external connectors, and the like, therein, as desired for a particular functionality. In some embodiments, the semiconductor device 300 may include more than one of the same type of device, or may include different devices. FIG. 12 shows a single semiconductor device 300, but in other embodiments one, two, or more than three semiconductor devices 300 may be attached to the redistribution structure 220.

The integrated devices 302 may be, for example, a semiconductor device or other device that includes one or more passive devices such as capacitors, resistors, inductors, and the like. The integrated devices 302 may be, for example, IPDs or MLCCs. In some embodiments, the routing distance between an electrical device 120 and the semiconductor device 300 may be less than the routing distance between an integrated device 302 and the semiconductor device 300. For example, the routing distance from an integrated device 302 and the semiconductor device 300 may include lateral routing along the redistribution layer 209A. Due, for example, to limitations of the placement process, the lateral distance between the integrated device 302 and the semiconductor device 300 may be a distance of about 0.5 mm or greater. In some embodiments, the total vertical thickness of the redistribution structure 220 may be less than a lateral distance between an integrated device 302 and the semiconductor device 300. For example, the total thickness of the redistribution structure 220 may be less than about 0.5 mm in some embodiments. Thus, a routing distance between an electrical device 120 and the semiconductor device 300 extending vertically through the redistribution structure 220 may be less than a routing distance between an integrated device 302 and the semiconductor device 300 extending laterally through the redistribution layer 209A.

Figure 13:
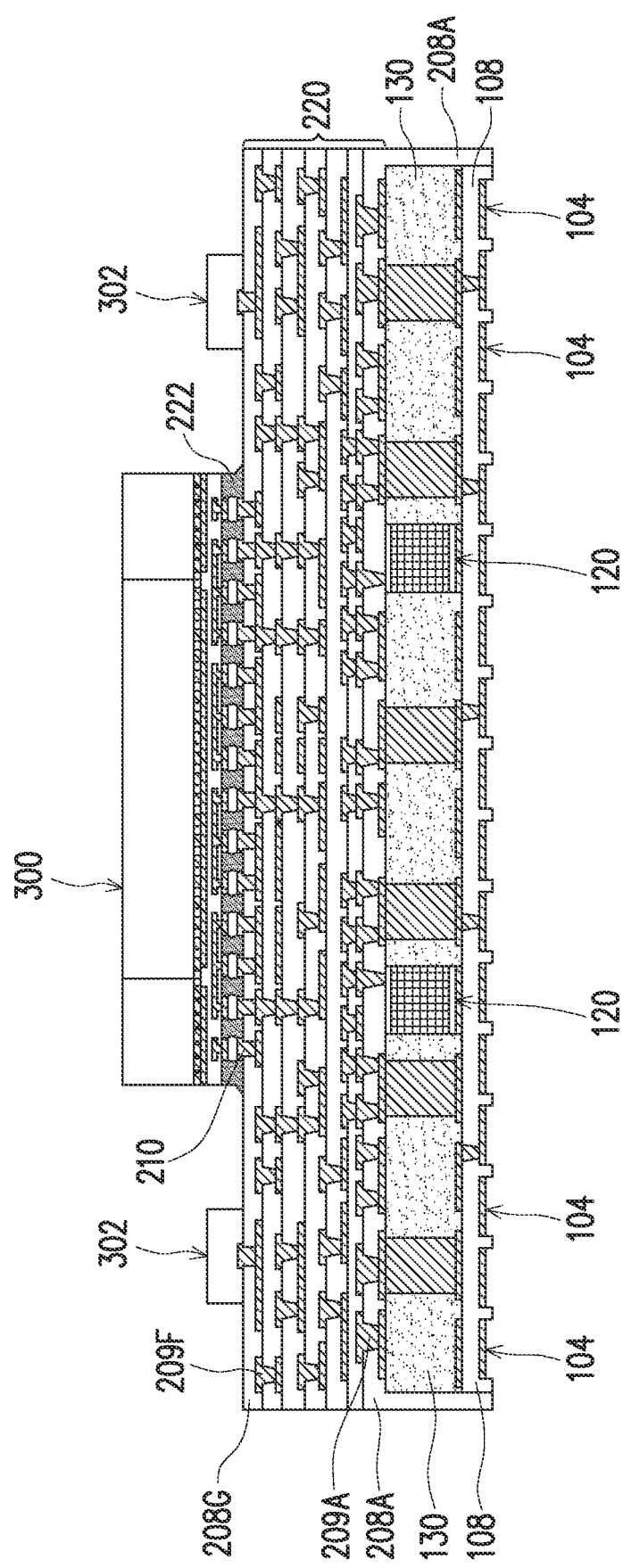

FIG. 13 illustrates a debonding of the carrier substrate 102, in accordance with some embodiments. The carrier substrate 102 may be debonded from the contact pads 104 and the first molding material 108 using, e.g., a thermal process to alter the adhesive properties of a release layer disposed on the carrier substrate 102. In a particular embodiment an energy source such as an ultraviolet (UV) laser, a carbon dioxide ($CO_2$) laser, or an infrared (IR) laser, is utilized to irradiate and heat the release layer until the release layer loses at least some of its adhesive properties. Once performed, the carrier substrate 102 and the release layer may be physically separated and removed from the contact pads 104 and the first molding material 108. In some embodiments, the structure may be flipped over attached to a temporary substrate (not shown), such as a tape, wafer, panel, frame, ring, or the like. FIG. 13 also shows the contact pads 104 after an optional recessing of the contact pads 104 has been performed. The recessing may be performed using an etching process such as a wet etching process, a dry etching process, or a combination.

FIG. 14 illustrates a singulation of the structure to form package structure 400, in accordance with some embodiments. In an embodiment, the structure may be singulated using one or more saw blades that separate the structure into discrete pieces, forming one or more singulated package structures 400. However, any suitable method of singulation, including laser ablation or one or more wet etches, may also be utilized. After singulation, the package structure 400 may be removed from a temporary substrate, if used. In some embodiments, the insulation layer 208A over the sidewalls of the first molding material 108 or the second molding material 130 may be removed by the singulation process. The first molding material 108, the second molding material 130, or the redistribution structure 220 may have sidewalls that are coplanar. In some embodiments, the package structure 400 may have lateral dimensions between about 5 mm by 5 mm and about 500 mm by 500 mm, such as about 14 mm by 14 mm, though a package structure 400 may have other dimensions than these. In some embodiments, the package structure 400 may have a vertical thickness between about 50 μm and about 3000 μm.

Still referring to FIG. 14, conductive connectors 404 are formed over and electrically connected to contact pads 104. The conductive connectors 404 may be, for example, contact bumps or solder balls, although any suitable type of connectors may be utilized. In an embodiment in which the conductive connectors 404 are contact bumps, the conductive connectors 404 may include a material such as tin, or other suitable materials, such as silver, lead-free tin, or copper. In an embodiment in which the conductive connectors 404 are tin solder bumps, the conductive connectors 404 may be formed by initially forming a layer of tin using such a technique such as evaporation, electroplating, printing, solder transfer, ball placement, etc. Once a layer of tin has been formed on the structure, a reflow may be performed in order to shape the material into the desired bump shape for the conductive connectors 404. The conductive connectors 404 may be formed prior to singulation or after singulation of the package structure 400. In some embodiments, the conductive connectors 404 may have a pitch between about 150 μm and about 1,000 μm.

Still referring to FIG. 14, an optional integrated device 406 is attached to the conductive pads 104, in accordance with some embodiments. The integrated device 406 may be a device, die, chip, or package, such as an IPD, MLCC, or the like. The integrated device 406 is electrically coupled to the contact pads 104 by conductive connectors. The conductive connectors may be, for example, conductive bumps, solder balls, conductive pads, or the like. The conductive connectors may be similar to the conductive connectors 404. The integrated device 406 may be placed using, e.g., a pick-and-place process.

By forming a package having conductive elements through vias or electrical devices in a layer comprising a molding material, the rigidity of the package may be improved. For example, a structure having larger lateral dimensions may be more prone to warping or delamination. Using the first molding material 108 and/or the second molding material 130 as described herein may provide structural support for the package structure 400, reducing warping of the package structure 400. In this manner, warping of a package may be reduced, and thus problems such as cracking or delamination associated with warping may be reduced. Additionally, the use of molding material may reduce the cost of manufacture relative to the use of other materials, structures, or processes, such as the use of an organic core structure or the use of processes such as a flip-chip process.

Additionally, by forming a package structure 400 in which the electrical devices 120 are disposed adjacent the through vias 112 or between the redistribution structure 220 and the contact pads 104, the electrical performance of the package structure 400 may be improved. For example, the distance between the electrical device 120 and the semiconductor device 300 may be reduced, which can reduce routing distance and thus reduce resistance or inductance between the electrical device 120 and the semiconductor device 300. For example, by reducing the distance in this manner, voltage drops due to resistance can also be reduced. By reducing the inductance, the high frequency performance of the package structure 400 may be improved. For example, the available frequency range of operation of the package may be increased. Additionally, the power integrity of the package structure 400 may be improved due to more stable electrical performance.

In some cases, the routing distance between a semiconductor device 300 and an electrical device 120 disposed on the opposite side of the redistribution structure 220 (as shown in FIG. 14) may be less than the routing distance between a semiconductor device 300 and a device mounted adjacent the semiconductor device 300, on the same side of the redistribution structure 220, such as integrated devices 302. The routing distance between an electrical device 120 and a semiconductor device 300 may also be less than the routing distance between a semiconductor device 300 and an integrated device mounted on the opposite side of the package structure 400, such as integrated device 406. In some embodiments, the vertical distance between an electrical device 120 and a semiconductor device 300 may be less than about 10 mm, such as a distance less than about 0.5 mm.

In some cases, the redistribution structure 220 may be formed using more robust and reliable techniques than other techniques such as the use of an organic core structure for routing. For example, the redistribution structure 220 may be formed (e.g., in a semiconductor fabrication plant) using a fan-out process. By using a more robust process, the redistribution structures 220 may have higher a yield than the use of other techniques. In some cases, the process for forming the redistribution structure 220 may form redistribution layers having smaller dimensions and having less line width roughness than other processes, such as a build-up process. In some cases, the line width roughness of the redistribution structure 220 may be less than about Ra=0.1 µm. In some cases, the line width roughness may be reduced without undesirable conductive skin effects. Thus, the redistribution structure 220 may have improved electrical performance relative to other types of routing structures such as organic core structures, particularly in the case of high frequency operation (e.g., greater than 2 Gbit/second). For example, the insulating layers (e.g., insulating layers 208A-G) of the redistribution structure 220 may be a dielectric material having low signal loss at higher frequencies, such as a dielectric material having a loss tangent Df that is less than about 0.1. For example, a polyimide material having a low loss tangent Df may be used. In some cases, the thickness of the insulating layers of the redistribution structure 220 may be less than the thickness of insulating layers of another type of routing structure, and thus may allow for reduced resistance and/or inductance of the routing formed within or on the insulating layers. By reducing signal loss, resistance, and/or inductance by using a redistribution structure 220, the signal integrity and efficiency of the package may be improved and electronic noise of the package may be reduced, particularly at higher speed operation. This can improve the performance of high-speed operation, for example, of Serializer/Deserializer ("SerDes") circuits or other circuits within the package that may be operated at higher speeds. In some cases, the overall thickness of the redistribution structure 220 may be less than the thickness of another type of routing structure, and thus the use of the redistribution structure 220 may allow for a smaller overall thickness of a package. Additionally, functional testing of the package may be performed in the same facility as manufacture, which can reduce overall testing time and cost.

In accordance with an embodiment, a method includes forming a first molding material layer over a carrier substrate, forming a through via over the first molding material layer, placing a first integrated passive device over the first molding material layer, wherein the first integrated passive device is laterally adjacent the through via, depositing a second molding material over the first molding material, the second molding material laterally surrounding the through via and laterally surrounding the first integrated passive device, forming a redistribution structure over the second molding material, the redistribution structure electrically connected to the through via, and placing a semiconductor device on the redistribution structure. In an embodiment, the method includes forming a plurality of contact pads over the carrier substrate, wherein the first molding material laterally surrounds the plurality of contact pads. In an embodiment, the method includes placing a second integrated passive device on the redistribution structure. In an embodiment, the first integrated passive device includes a multi-layer ceramic capacitor (MLCC). In an embodiment, forming the redistribution structure includes forming an insulation layer on a top surface of the second molding material and on sidewalls of the first molding material and on sidewalls of the second molding material. In an embodiment, the redistribution structure is electrically connected to the first integrated passive device. In an embodiment, the method includes forming a metallization layer on the second molding material, wherein the redistribution structure is electrically connected to the through via by the metallization layer. In an embodiment, the first integrated passive device is free of the metallization layer.

In accordance with an embodiment, a method includes forming multiple contact pads on a carrier substrate, forming a first molding material layer over the plurality of contact pads, forming a first metallization layer on the first molding material layer, the first metallization layer electrically connected to the contact pads through the first molding material layer, forming through vias on the first metallization layer and electrically connected to the first metallization layer, attaching a first passive device to the first metallization layer forming a second molding material layer over the first molding material layer, the first passive device, and the through vias, forming a redistribution structure on the second molding material layer, the redistribution structure electrically connected to the through vias and electrically connected to the first passive device, attaching a semiconductor die to the redistribution structure, the semiconductor die electrically connected to the redistribution structure. In an embodiment, the first passive device is laterally disposed between two through vias of the through vias. In an embodiment, the method includes performing a planarization process on the second molding material layer, the planarization process exposing a surface of the first passive device. In an embodiment, attaching the passive device to the metallization layer includes electrically connecting the first passive device to the metallization layer. In an embodiment, the method includes attaching a second passive device to a contact pad of the contact pads. In an embodiment, a method includes forming a second metallization layer on the second molding material layer. In an embodiment, the method includes forming vias extending through the first molding material layer to the contact pads.

In accordance with an embodiment, a package includes a first layer of molding material, a first metallization layer on the first layer of molding material, a second layer of molding material on the first metallization layer and the first layer of molding material, a second metallization layer on the second layer of molding material, through vias within the second layer of molding material, the through vias extending from the first metallization layer to the second metallization layer, integrated passive devices within the second layer of molding material, a redistribution structure electrically on the second metallization layer and the second layer of molding material, the redistribution structure connected to the through vias and the integrated passive devices, and at least one semiconductor device on the redistribution structure, the at least one semiconductor device connected to the redistribution structure. In an embodiment, the first molding material is the same material as the second molding material. In an embodiment, surfaces of the integrated passive devices, surfaces of the through vias, and a surface of the second layer of molding material are coplanar. In an embodiment, a sidewall of the first layer of molding material, a sidewall of the second layer of molding material, and a sidewall of the redistribution structure are coplanar. In an embodiment, the integrated passive devices include at least one multi-layer ceramic capacitor (MLCC).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
   a first layer of molding material;
   a first metallization layer on the first layer of molding material;
   a second layer of molding material on the first metallization layer and the first layer of molding material, wherein the second layer of molding material extends along sidewalls of the first metallization layer;
   a second metallization layer on the second layer of molding material;
   a plurality of through vias within the second layer of molding material, the plurality of through vias extending from the first metallization layer to the second metallization layer;
   a plurality of integrated passive devices within the second layer of molding material;
   a redistribution structure electrically on the second metallization layer and the second layer of molding material, the redistribution structure connected to the plurality of through vias and the plurality of integrated passive devices; and
   at least one semiconductor device on the redistribution structure, the at least one semiconductor device connected to the redistribution structure.

2. The package of claim 1, wherein the first layer of molding material is a same material as the second layer of molding material, wherein the first layer of molding material contacts the second layer of molding material.

3. The package of claim 1, wherein surfaces of the plurality of integrated passive devices, surfaces of the plurality of through vias, and a surface of the second layer of molding material are coplanar.

4. The package of claim 1, wherein a sidewall of the first layer of molding material, a sidewall of the second layer of molding material, and a sidewall of the redistribution structure are coplanar.

5. The package of claim 1, wherein the plurality of integrated passive devices comprise at least one multi-layer ceramic capacitor (MLCC).

6. The package of claim 1, further comprising a conductive element on a side of the first layer of molding material opposite the first metallization layer, wherein the first layer of molding material extends along sidewalls of the conductive element.

7. The package of claim 6, wherein the conductive element is recessed from the side of the first layer of molding material.

8. A package, comprising:
   a first molding material layer;
   a through via over a first side of the first molding material layer;
   a first integrated passive device over the first side of the first molding material layer, wherein the first integrated passive device is laterally adjacent the through via;
   a second molding material layer over the first side of the first molding material layer, the second molding material layer laterally surrounding the through via and laterally surrounding the first integrated passive device, wherein the first molding material layer directly contacts the second molding material layer; and
   a redistribution structure over the second molding material layer, the redistribution structure comprising a first conductive element electrically connected to the through via, wherein a region between the redistribution structure and the first molding material layer is free of active devices.

9. The package of claim 8, further comprising a semiconductor device on the redistribution structure, wherein the redistribution structure is interposed between the semiconductor device and the through via.

10. The package of claim 9, wherein the first integrated passive device is within lateral boundaries of the semiconductor device in a cross-sectional view.

11. The package of claim 9, wherein the through via is within lateral boundaries of the semiconductor device in a cross-sectional view.

12. The package of claim 8, further comprising a plurality of contact pads on a second side of the first molding material layer, wherein a first contact pad of the plurality of contact pads is electrically coupled to the through via.

13. The package of claim 12, wherein the first molding material layer laterally surrounds the plurality of contact pads.

14. The package of claim 12, further comprising an integrated second passive device coupled to the plurality of contact pads.

15. A package, comprising:
   a first molding layer;
   a first metallization layer on the first molding layer, the first metallization layer comprising a first conductive element and a second conductive element;
   a first integrated passive device having a first contact on a first side and a second contact on a second side, wherein the first contact is coupled to the first conductive element of the first metallization layer;
   a through via on the second conductive element of the first metallization layer;
   a second molding layer over the first molding layer, wherein the second molding layer extends along sidewalls of the first conductive element and the second conductive element;
   a second metallization layer on the second molding layer, the second metallization layer comprising a third conductive element and a fourth conductive element, wherein the third conductive element is coupled to the second contact of the first integrated passive device, wherein the fourth conductive element is coupled to the through via;

a redistribution structure on the second metallization layer; and a semiconductor device attached to the redistribution structure.

16. The package of claim 15, further comprising an external contact pad along a lower surface of the first molding layer, wherein the first molding layer covers a sidewall of the external contact pad.

17. The package of claim 16, further comprising a solder joint on the external contact pad.

18. The package of claim 16, further comprising a second integrated passive device coupled to the external contact pad.

19. The package of claim 16, wherein the external contact pad is recessed from a lower surface of the first molding layer.

20. The package of claim 15, wherein the through via and the first integrated passive device have a same height.

* * * * *